US009728626B1

(12) United States Patent
Schepis et al.

(10) Patent No.: US 9,728,626 B1
(45) Date of Patent: Aug. 8, 2017

(54) ALMOST DEFECT-FREE ACTIVE CHANNEL REGION

(71) Applicant: GLOBALFOUNDRIES Inc., Grand Cayman (KY)

(72) Inventors: Dominic J. Schepis, Wappingers Falls, NY (US); Charan V. Surisetty, Clifton Park, NY (US); Kangguo Cheng, Schenectady, NY (US); Alexander Reznicek, Rensselaer, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/251,435

(22) Filed: Aug. 30, 2016

(51) Int. Cl.
*H01L 21/336* (2006.01)
*H01L 29/66* (2006.01)
(Continued)

(52) U.S. Cl.
CPC .. *H01L 29/66795* (2013.01); *H01L 21/02636* (2013.01); *H01L 21/30604* (2013.01);
(Continued)

(58) Field of Classification Search
CPC ......... H01L 29/66795; H01L 21/02636; H01L 21/30604; H01L 29/0653; H01L 29/1054;
(Continued)

(56) References Cited

U.S. PATENT DOCUMENTS 8,324,660 B2 12/2012 Lochtefeld et al.
8,796,758 B2 8/2014 Lin et al.
(Continued)

FOREIGN PATENT DOCUMENTS

CN 103177971 6/2013

OTHER PUBLICATIONS

Paladagu, et al., "Site Selective Integration of III-V Materials on Si for Nanoscale Logic and Photonic Devices," Crystal Growth & Design, 12(10), pp. 4696-4702 (2012).
(Continued)

*Primary Examiner* — Jarrett Stark
*Assistant Examiner* — Shahed Ahmed
(74) *Attorney, Agent, or Firm* — Wayne F. Reinke, Esq.; Heslin Rothenberg Farley & Mesiti P.C.

(57) ABSTRACT

A FinFET includes a fin and a conductive gate surrounding a top channel region of the fin, the channel region of the fin being filled with an epitaxial semiconductor channel material extending below a bottom surface of the conductive gate. The top channel region of the fin includes epitaxial semiconductor channel material that is at least majority defect free, the at least a majority of defects associated with forming the epitaxial semiconductor material in the channel region being trapped below a top portion of the channel region. The FinFET may be achieved by a method, the method including providing a starting semiconductor structure, the starting semiconductor structure including a bulk semiconductor substrate, semiconductor fin(s) on the bulk semiconductor substrate and surrounded by a dielectric layer, and a dummy gate over a channel region of the semiconductor fin(s). The method further includes forming source and drain recesses adjacent the channel region, removing the dummy gate, recessing the semiconductor fin(s), the recessing leaving a fin opening above the recessed semiconductor fin(s), and growing epitaxial semiconductor channel material in the fin opening, such that at least a majority of defects associated with the growing are trapped at a bottom portion of the at least one fin opening.

9 Claims, 10 Drawing Sheets

(51) Int. Cl.
*H01L 21/02* (2006.01)
*H01L 21/306* (2006.01)
*H01L 29/32* (2006.01)
*H01L 29/10* (2006.01)
*H01L 29/06* (2006.01)

(52) U.S. Cl.
CPC ...... *H01L 29/0653* (2013.01); *H01L 29/1054* (2013.01); *H01L 29/1083* (2013.01); *H01L 29/32* (2013.01); *H01L 29/6653* (2013.01); *H01L 29/66545* (2013.01)

(58) Field of Classification Search
CPC . H01L 29/1083; H01L 29/32; H01L 29/6653; H01L 29/66545; H01L 21/02293; H01L 21/20; H01L 21/2033
USPC ......... 257/288, 368, 369; 151/191, 197, 199
See application file for complete search history.

(56) References Cited

U.S. PATENT DOCUMENTS

| | | | |
|---|---|---|---|
| 2010/0072515 | A1 | 3/2010 | Park et al. |
| 2011/0210374 | A1 | 9/2011 | Lochtefeld |
| 2012/0032234 | A1 | 2/2012 | Wang et al. |
| 2012/0199876 | A1 | 8/2012 | Bai et al. |
| 2013/0099282 | A1 | 4/2013 | Chen et al. |
| 2013/0115721 | A1 | 5/2013 | Clark |
| 2013/0228864 | A1 | 9/2013 | Mieno |
| 2015/0024573 | A1 | 1/2015 | Jacob et al. |
| 2016/0141370 | A1* | 5/2016 | Cheng ............... H01L 21/82343 257/347 |
| 2017/0005177 | A1* | 1/2017 | Cheng ................. H01L 29/7851 |

OTHER PUBLICATIONS

Fiorenza, et al., "Aspect Ratio Trapping: a Unique Technology for Integrating Ge and III-Vs with Silicon CMOS," ECS Transactions, 33 (6) pp. 963-976 (2010).

Wu, et al., "Atomic-layer-deposited Al2O3 /GaAs metal-oxide-semiconductor field-effect transistor on Si substrate using aspect ratio trapping technique," Applied Physics Letters 93, 242106-1 to 3 (2008).

Merckling, et al., "Selective area growth of InP in shallow trench isolation on large scale Si(001) wafer using defect confinement technique," Journal of Applied Physics 114, 033708-1 to 6 (2013).

Li, et al., "Thin Film InP Epitaxy on Si (001) Using Selective Aspect Ratio Trapping," ECS Transactions, 18 (1) pp. 887-894 (2009).

Chu, et al., "Nanoscale Growth of GaAs on Patterned Si(111) Substrates by Molecular Beam Epitaxy," Crystal Growth & Design, 14(2), pp. 593-598 (2013).

Tomioka, at al., "A III-V nanowire channel on silicon for high-performance vertical transistors," Nature, 488(7410), pp. 189-192 (2012).

Li, et al., "Growing antiphase-domain-free GaAs thin films out of highly ordered planar nanowire arrays on exact (001) silicon," Applied Physics Letters, 106(7), 072105-1 to 4 (2015).

Vellianitis, et al., "High crystalline quality Ge grown by MOCVD inside narrow shallow trench isolation defined on Si (001) substrates," Journal of Crystal Growth, 383, pp. 9-11 (2013).

* cited by examiner

ALMOST DEFECT-FREE ACTIVE CHANNEL REGION

BACKGROUND OF THE INVENTION

Technical Field

The present invention generally relates to FinFET fabrication. More particularly, the present invention relates to fabricating a FinFET with almost defect-free active channel region.

Background Information

Currently, FinFET fabrication includes many steps. For example, epitaxial semiconductor material is sometimes used atop the channel region. Defects at the interface with the fin, due to different lattice constants, can cause significant performance degradation.

SUMMARY

Thus, a need exists to minimize or eliminate defects in epitaxial semiconductor channel material.

The shortcomings of the prior art are overcome and additional advantages are provided through the provision, in one aspect, of a method of fabricating a semiconductor structure. The method includes providing a starting semiconductor structure, the starting semiconductor structure including a bulk semiconductor substrate, at least one semiconductor fin on the bulk semiconductor substrate that is surrounded by a dielectric layer, and a dummy gate over a channel region of the at least one semiconductor fin. The method further includes forming source and drain recesses adjacent the channel region, filling the source and drain recesses with a dielectric material, removing the dummy gate, recessing the channel region of the at least one semiconductor fin, the recessing leaving a fin opening above the recessed at least one semiconductor fin, and growing epitaxial semiconductor channel material in the fin opening, such that at least a majority of defects associated with the growing are trapped at a bottom portion of the fin opening.

In accordance with another aspect, a method is provided. The method includes providing a bulk semiconductor substrate, forming a plurality of fins on the bulk semiconductor substrate, and forming a plurality of channels, replacing channel regions of the plurality of fins, with epitaxial semiconductor channel material having at least a majority of defects associated with the forming of the plurality of channels being trapped at a bottom portion of the plurality of channels, top portions of the plurality of channels being active channel regions and almost defect-free.

In accordance with yet another aspect, a FinFET is provided. The FinFET includes a substrate, a fin on the substrate, the fin having a source region, a drain region and a channel region therebetween, the channel region having a non-epitaxial original portion on the substrate and a region of epitaxial semiconductor channel material on the non-epitaxial original portion, and a conductive gate surrounding a top portion of the region of epitaxial semiconductor channel material, the region of epitaxial semiconductor channel material extending below the conductive gate. Defects associated with forming the epitaxial semiconductor channel material in the region are trapped below the top portion of the region of epitaxial semiconductor channel material.

These, and other objects, features and advantages of this invention will become apparent from the following detailed description of the various aspects of the invention taken in conjunction with the accompanying drawings.

DETAILED DESCRIPTION OF EMBODIMENTS OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

As used herein, the term "epitaxial channel material" refers to any silicon-containing materials, non-limiting examples including silicon, single-crystal silicon, polycrystalline silicon, amorphous silicon, silicon on nothing, silicon on insulator and silicon germanium. The channel may also include other materials such as germanium (Ge), and compound semiconductors, such as Silicon carbide (SiC), gallium arsenide (GaAs), gallium phosphide, indium phosphide, indium arsenide or indium antimonide or other compounds from periods III and V of the periodic table, or combinations thereof.

Reference is made below to the drawings, which are not drawn to scale for ease of understanding, wherein the same reference numbers are used throughout different figures to designate the same or similar components.

Figure 1A:
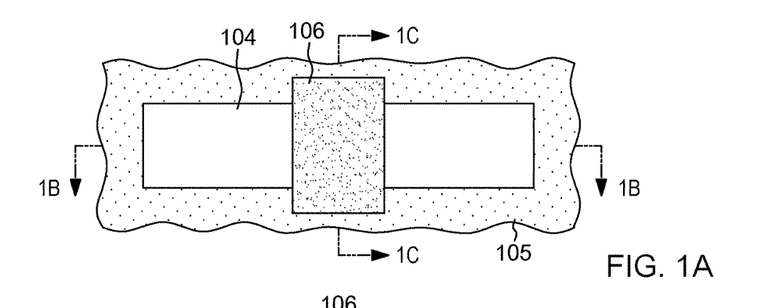
FIGS. 1A-1C include two cross-sectional views (FIGS. 1B and 1C) and a top-down view (FIG. 1A) of one example of a starting semiconductor structure, the starting semiconductor structure including a bulk semiconductor substrate, a semiconductor fin on the substrate surrounded by a dielectric material, and a dummy gate (e.g., polysilicon) over a channel region of the fin, in accordance with one or more aspects of the present invention.
Figure 1B:
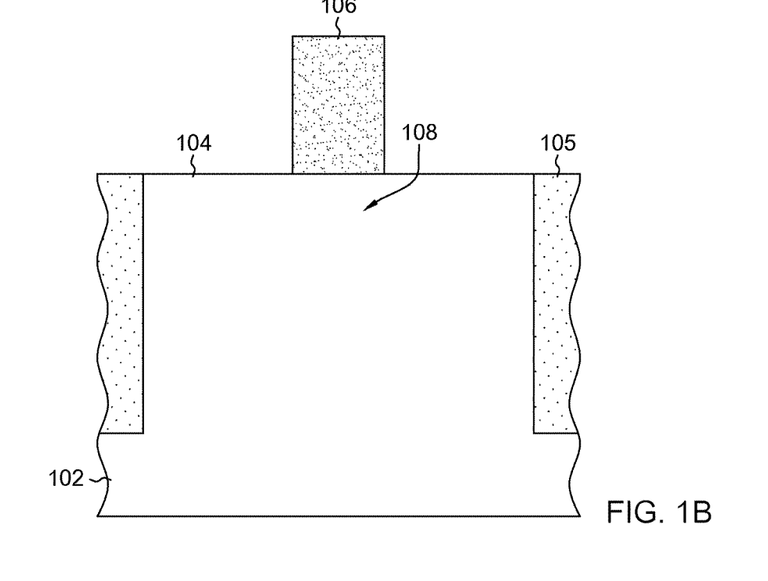
Figure 1C:
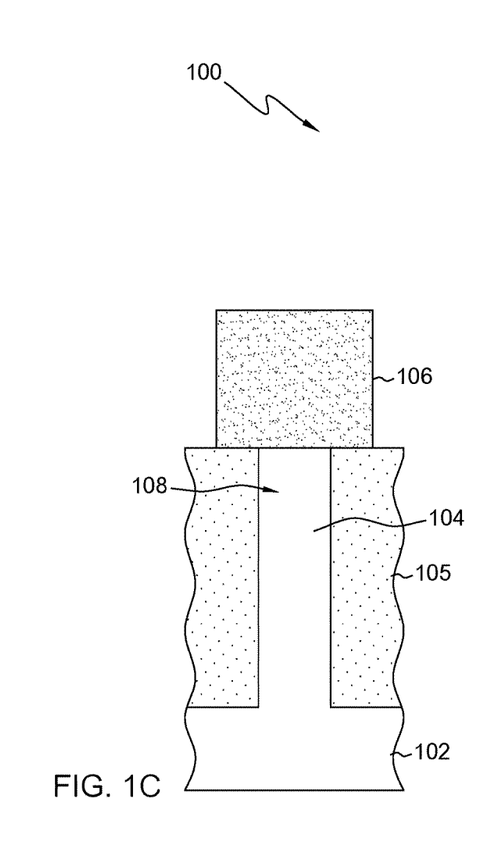

FIGS. 1A-1C include two cross-sectional views (FIGS. 1B and 1C) and a top-down view (FIG. 1A) of one example of a starting semiconductor structure 100, the starting semiconductor structure including a bulk semiconductor substrate 102, a semiconductor fin 104 on the substrate and surrounded by a dielectric material 105, and a dummy gate 106 (e.g., polysilicon) over a channel region 108 of the fin, in accordance with one or more aspects of the present invention.

The starting structure may be conventionally fabricated, for example, using known processes and techniques. Although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Figure 2A:
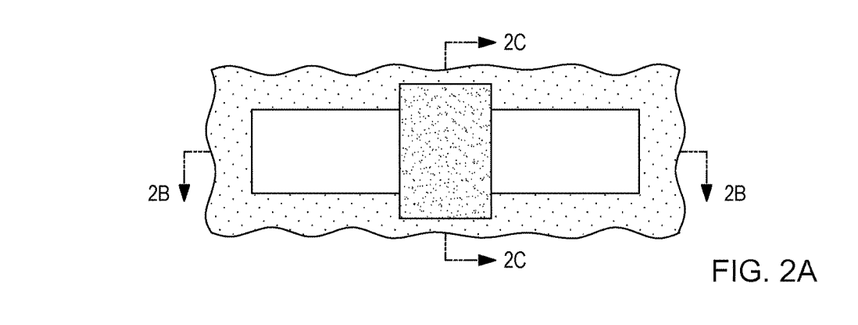
FIGS. 2A-2C depict one example of two cross-sectional views (FIGS. 2B and 2C) and a top-down view (FIG. 2A) of the structure of FIGS. 1A-1C after recessing to form source/drain openings on opposite sides of the channel region, in accordance with one or more aspects of the present invention.
Figure 2B:
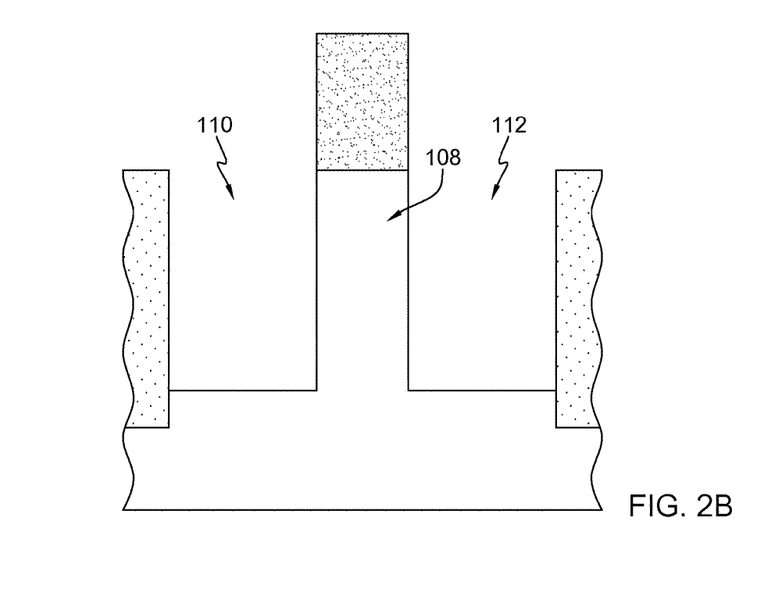
Figure 2C:
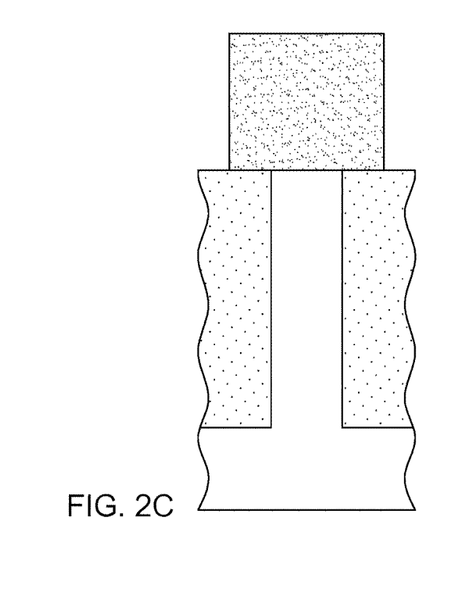

FIGS. 2A-2C depict one example of two cross-sectional views (FIGS. 2B and 2C) and a top-down view (FIG. 2A) of the structure 100 of FIGS. 1A-1C after recessing to form source/drain openings 110 and 112 on opposite sides of the channel region 108, in accordance with one or more aspects of the present invention.

At this point, a silicon etch (RIE with CF4 or SF6 for example) is used to anisotropically etch down fin 104 down to the bottom of the fin or approximately even with the depth of oxide layer 105. The fin height is decided earlier in the process during the formation of fin 104. If the fin is on SOI, for example, then the etch would continue down to the buried oxide (BOX). The fin remaining underneath the dummy gate is the channel region, and the source and drain regions of the fin are etched back and removed by this etch. They are later re-grown by epitaxy later in the process as subsequently described with regard to FIGS. 9A-9C.

Figure 3A:
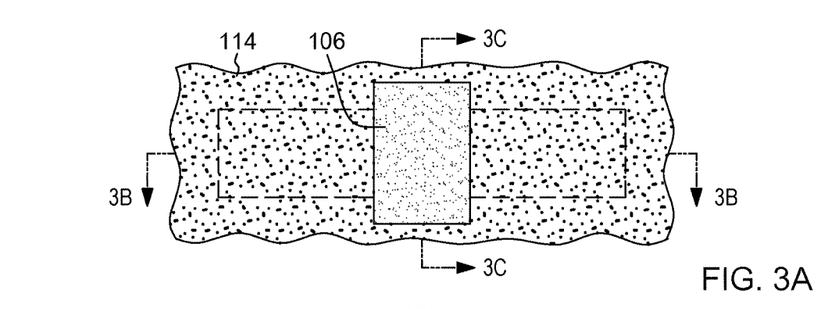
FIGS. 3A-3C depict one example of two cross-sectional views (FIGS. 3B and 3C) and a top-down view (FIG. 3A) of the structure of FIGS. 2A-2C after forming additional dielectric material in the source and drain openings, as well as forming the additional dielectric material adjacent the dummy gate, in accordance with one or more aspects of the present invention.
Figure 3B:
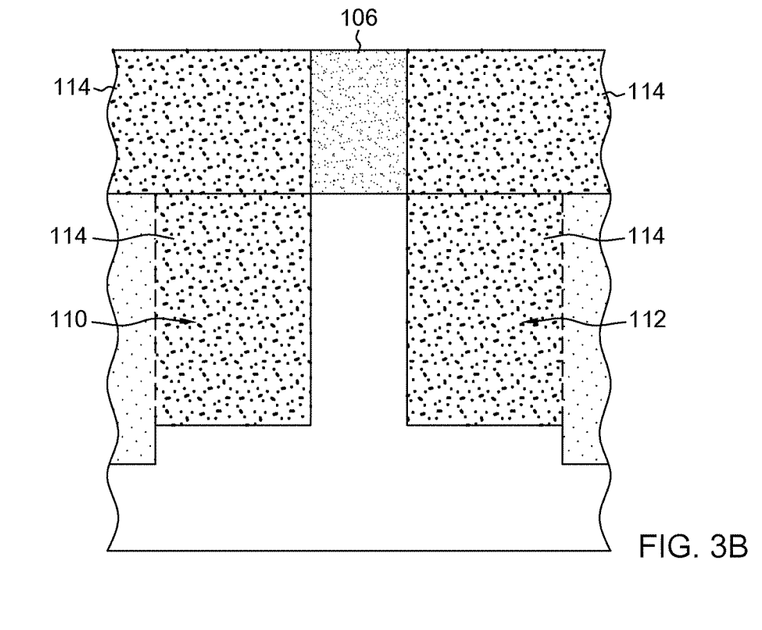
Figure 3C:
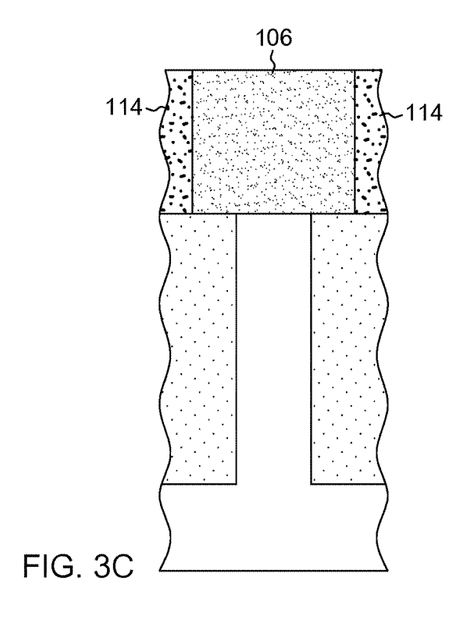

FIGS. 3A-3C depict one example of two cross-sectional views (FIGS. 3B and 3C) and a top-down view (FIG. 3A) of the structure of FIGS. 2A-2C after forming additional dielectric material 114 in the source and drain openings 110 and 112, respectively, as well as forming the additional dielectric material adjacent the dummy gate 106, in accordance with one or more aspects of the present invention.

Forming the additional dielectric material 114 (e.g., an oxide) may be accomplished, for example, using a deposition process. In another example, the additional dielectric material is overfilled, then planarized to a top of the dummy gate 106, for example, using a chemical-mechanical polishing process.

Figure 4A:
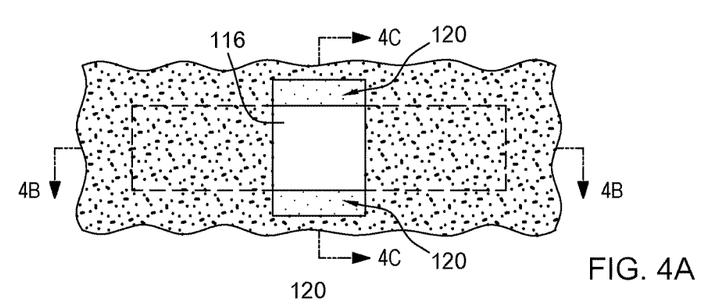
FIGS. 4A-4C depict one example of two cross-sectional views (FIGS. 4B and 4C) and a top-down view (FIG. 4A) of the structure of FIGS. 3A-3C after removing the dummy gate and partially recessing the fin, leaving a remaining fin portion along with a fin opening and a gate opening, in accordance with one or more aspects of the present invention.
Figure 4B:
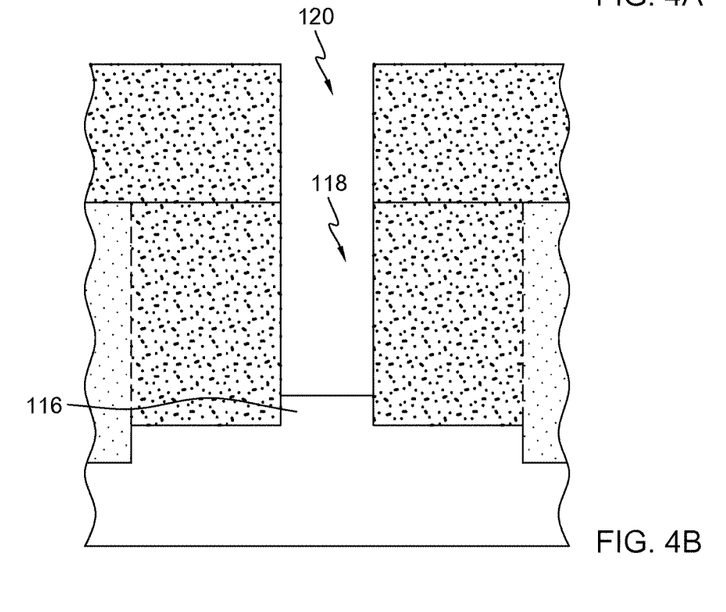
Figure 4C:
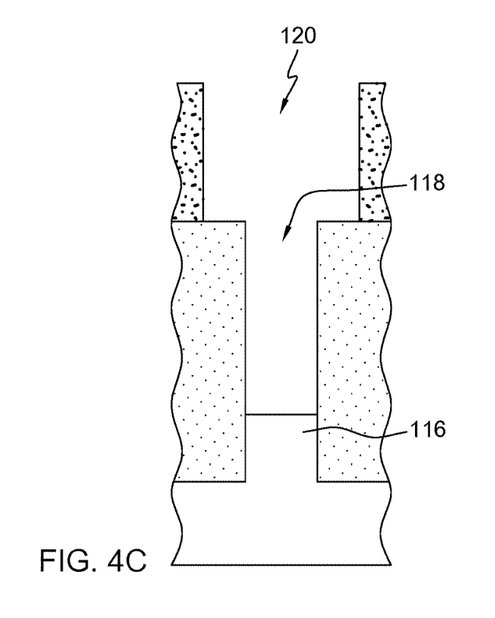

FIGS. 4A-4C depict one example of two cross-sectional views (FIGS. 4B and 4C) and a top-down view (FIG. 4A) of the structure of FIGS. 3A-3C after removing the dummy gate 106 and partially recessing the fin 104, leaving a remaining fin portion 116 along with fin opening 118 and a gate opening 120, in accordance with one or more aspects of the present invention.

The fin should be recessed substantially more than half the height of the fin. In a typical example, the total fin height can be 40 nm tall. In this case the fin would be recessed down about 30 nm, leaving about 10 nm remaining. Recessing within these parameters should leave enough remaining fin on which to grow epitaxial material, since a "template" is needed to grow from. The lowest useful remaining fin height is about 10 nm. Therefore, the fin recess leaves about 10 nm remaining, or more generally, substantially less than half the original fin height.

Figure 5A:
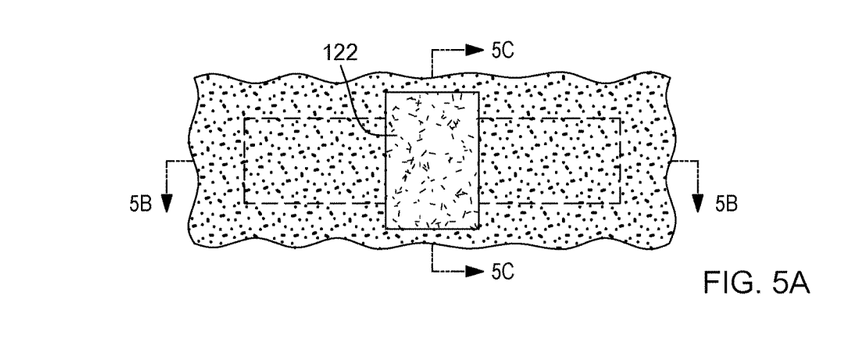
FIGS. 5A-5C depict one example of two cross-sectional views (FIGS. 5B and 5C) and a top-down view (FIG. 5A) of the structure of FIGS. 4A-4C after overgrowing epitaxial semiconductor channel material on a top surface of the remaining fin portion in the fin opening and the gate opening, such that at least a majority of defects in the epitaxial semiconductor channel material, described below, are naturally concentrated near an interface with the remaining fin portion, leaving almost defect-free epitaxial semiconductor channel material in an active portion of the channel opposite the defects, in accordance with one or more aspects of the present invention. The defects are due to the different lattice constants of the epitaxial semiconductor channel material and the fin.
Figure 5B:
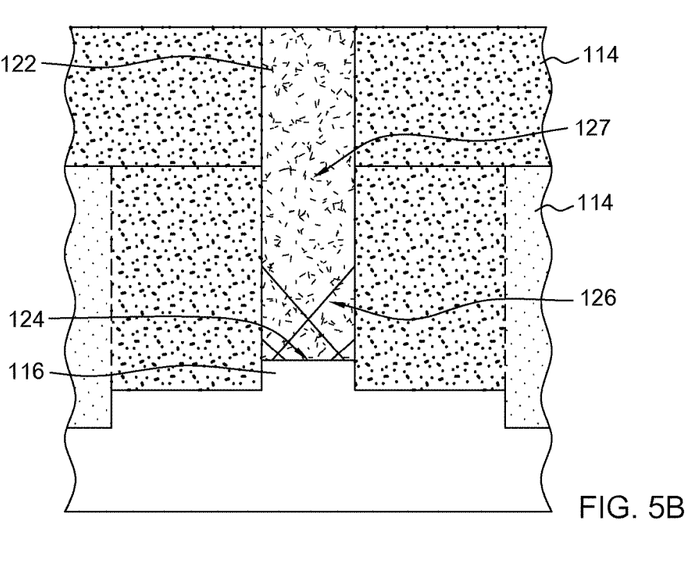
Figure 5C:
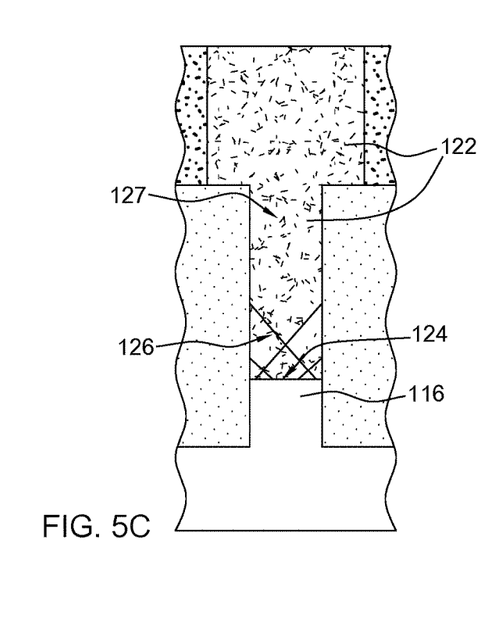

FIGS. 5A-5C depict one example of two cross-sectional views (FIGS. 5B and 5C) and a top-down view (FIG. 5A) of the structure of FIGS. 4A-4C after overgrowing epitaxial semiconductor channel material 122 on a top surface 124 of remaining fin portion 116 in the fin opening (118, FIGS. 4B and 4C) and the gate opening (120, FIGS. 4A-4C), such that at least a majority of defects 126 which may occur in the epitaxial semiconductor channel material during growth as being described below, would be naturally concentrated near an interface with the remaining fin portion, leaving almost defect-free epitaxial semiconductor channel material in an active portion 127 of the channel opposite the defects, in accordance with one or more aspects of the present invention. The defects are due to the different lattice constants of the epitaxial semiconductor channel material and the fin.

"Defects," as used herein, refers to crystallographic defects or regions in the semiconductor crystal where the precisely oriented atomic structure is disrupted (usually by stress or other atoms in the lattice). For example, epitaxial channel material is grown on top of the remaining fin portion 116. If a channel epitaxy film of Germanium is then grown, for example, the Ge to Ge spacing of the atoms is different than the spacing of silicon to silicon atoms. This means that as the atoms of Ge try to bond and align to the silicon atoms already present, they will be under a lot of strain, since they want to have a different spacing than the silicon atoms allow. Once the growing film becomes thick enough, the strain is too much for the film to contain, so a small break or dislocation in the crystal forms. This is what is meant by "defects." These are often long in length and the present disclosure allows for those defects to form, but then they travel far enough to terminate the dielectric material 114. After those defects terminate at an interface, they cannot move any further. Therefore, the rest of the film above that area is now at least majority defect free and possibly fully defect-free since it may be 100% Ge in this case, and can grow without further defects.

Figures 6A, 6B, 6C:
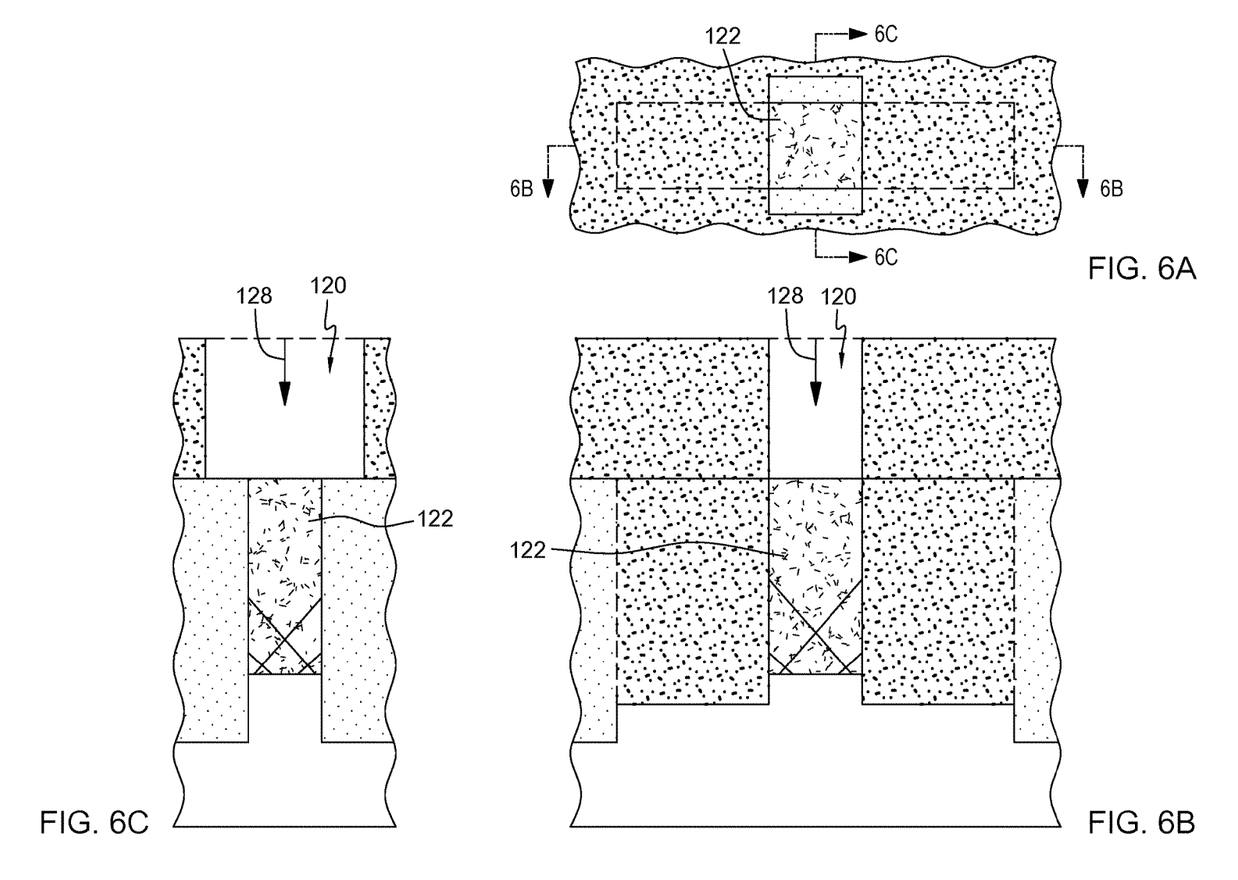
FIGS. 6A-6C depict one example of two cross-sectional views (FIGS. 6B and 6C) and a top-down view (FIG. 6A) of the structure of FIGS. 5A-5C after recessing the epitaxial semiconductor channel material, and reestablishing the gate opening, in accordance with one or more aspects of the present invention.

FIGS. 6A-6C depict one example of two cross-sectional views (FIGS. 6B and 6C) and a top-down view (FIG. 6A) of the structure of FIGS. 5A-5C after recessing 128 the epitaxial semiconductor channel material 122, reestablishing gate opening 120, in accordance with one or more aspects of the present invention. The recess may be accomplished, for example, using conventional processes and techniques. For example, a dry etch or RIE or plasma etch using a precursor such as $CF_4$ would etch many of the channel films. A specific wet etch, such as $NH_4OH$, would also etch many silicon compounds. In practice, selectivity to the dielectrics surrounding the epitaxial channel is employed, such that selectivity will determine the exact chemistry or conditions used.

Figure 7A:
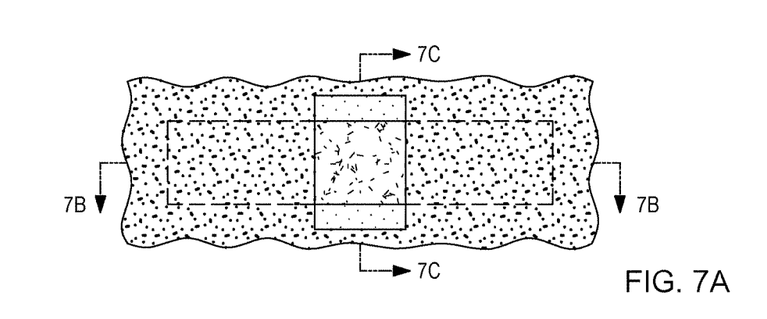
FIGS. 7A-7C depict one example of two cross-sectional views (FIGS. 7B and 7C) and a top-down view (FIG. 7A) of the structure of FIG. 6 after recessing the dielectric material adjacent a top (active) portion of the epitaxial semiconductor channel material under the gate opening, in accordance with one or more aspects of the present invention.
Figure 7B:
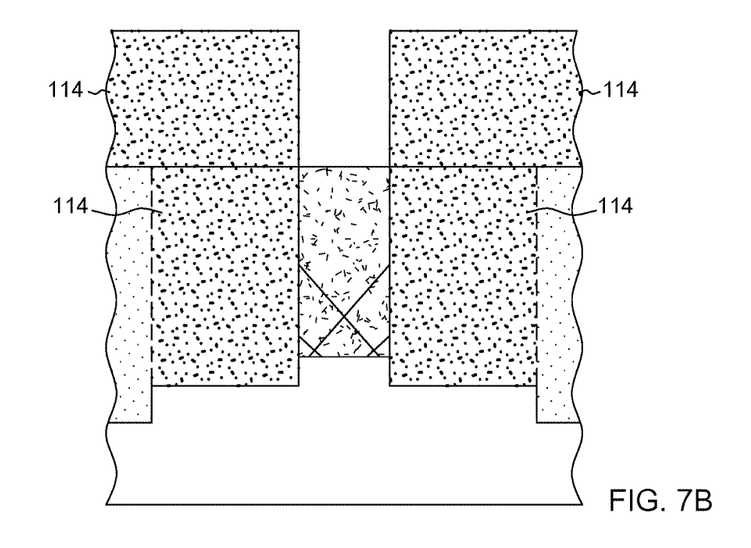
Figure 7C:
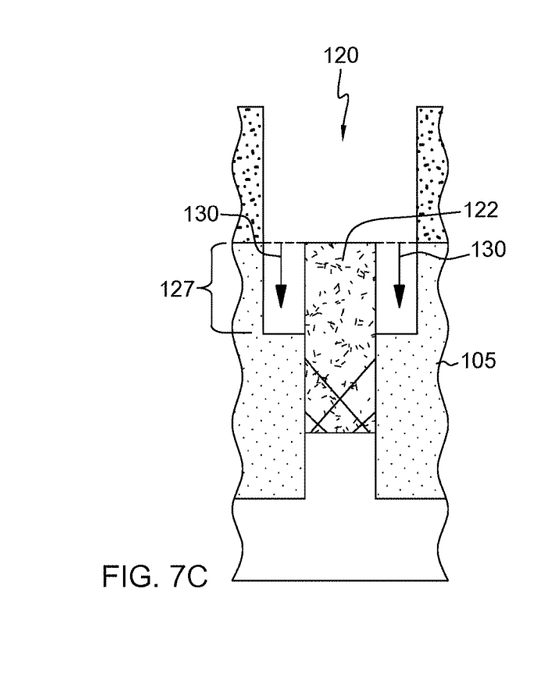

FIGS. 7A-7C depict one example of two cross-sectional views (FIGS. 7B and 7C) and a top-down view (FIG. 7A) of the structure of FIGS. 6A-6C after recessing 130 the dielectric material 105 adjacent a top (active) portion 127 of the epitaxial semiconductor channel material 122 under gate opening 120, in accordance with one or more aspects of the present invention.

Figures 8A, 8B, 8C:
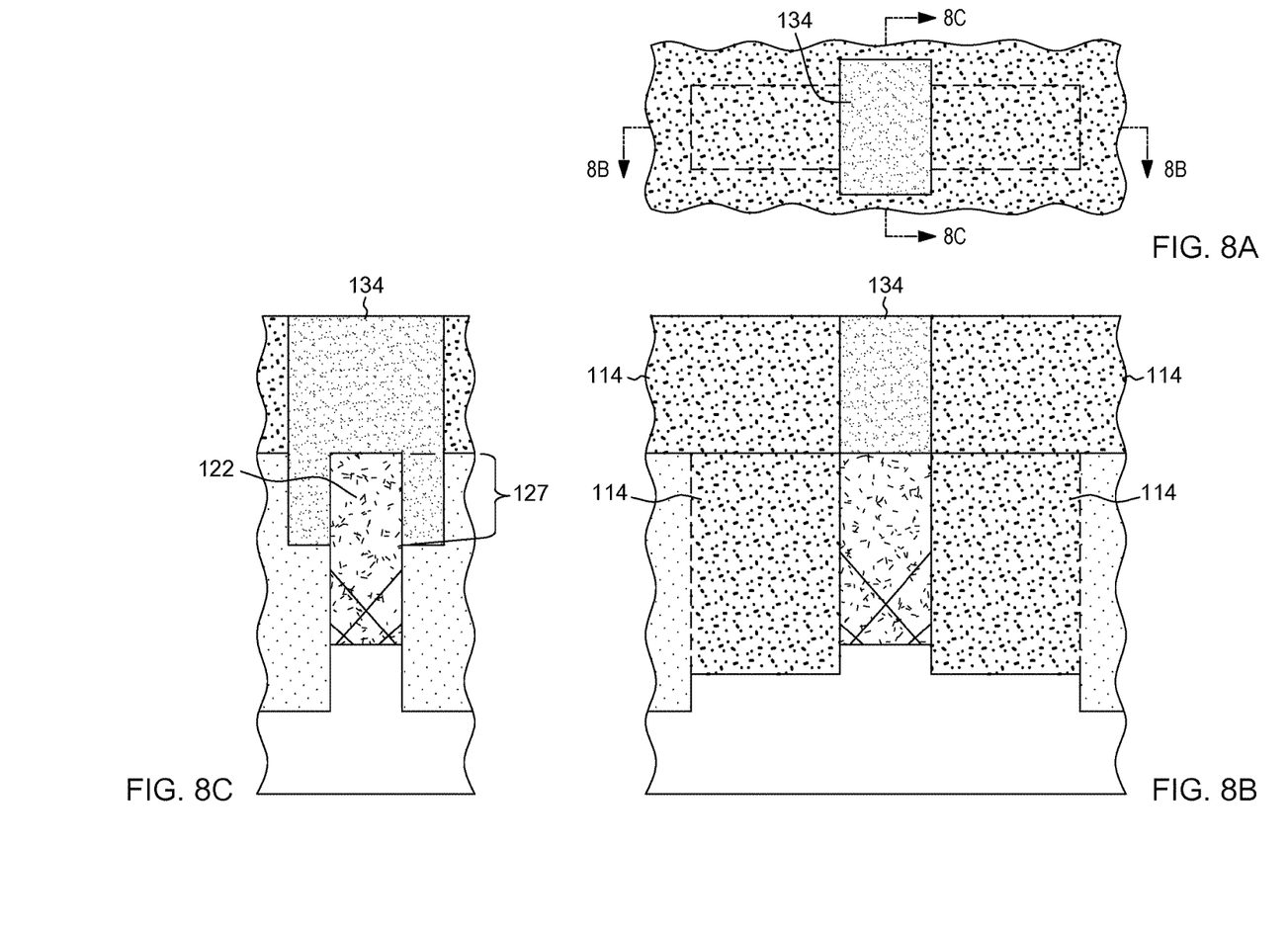
FIGS. 8A-8C depict one example of two cross-sectional views (FIGS. 8B and 8C) and a top-down view (FIG. 8A) of the structure of FIGS. 7A-7C after forming another dummy gate surrounding the top (active) portion of the epitaxial semiconductor channel material, in accordance with one or more aspects of the present invention.

FIGS. 8A-8C depict one example of two cross-sectional views (FIGS. 8B and 8C) and a top-down view (FIG. 8A) of the structure of FIGS. 7A-7C after forming another dummy gate 134 surrounding the top (active) portion 127 of the epitaxial semiconductor channel material 122, in accordance with one or more aspects of the present invention.

Figure 9A:
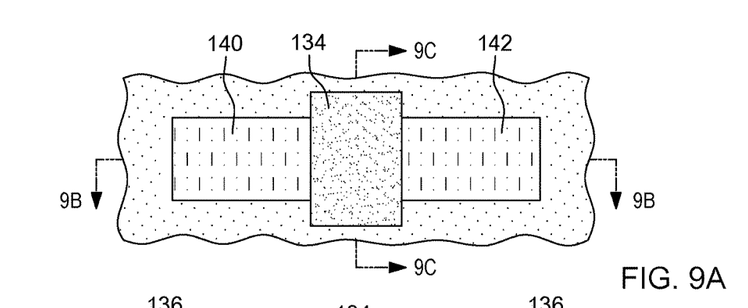
FIGS. 9A-9C depict one example of two cross-sectional views (FIGS. 9B and 9C) and a top-down view (FIG. 9A) of the structure of FIGS. 8A-8C after recessing the dielectric material down to a bottom of the active portion, and growing epitaxial semiconductor material adjacent opposite sides of the top (active) portion of the epitaxial semiconductor channel material, forming a source and a drain, in accordance with one or more aspects of the present invention.
Figure 9B:
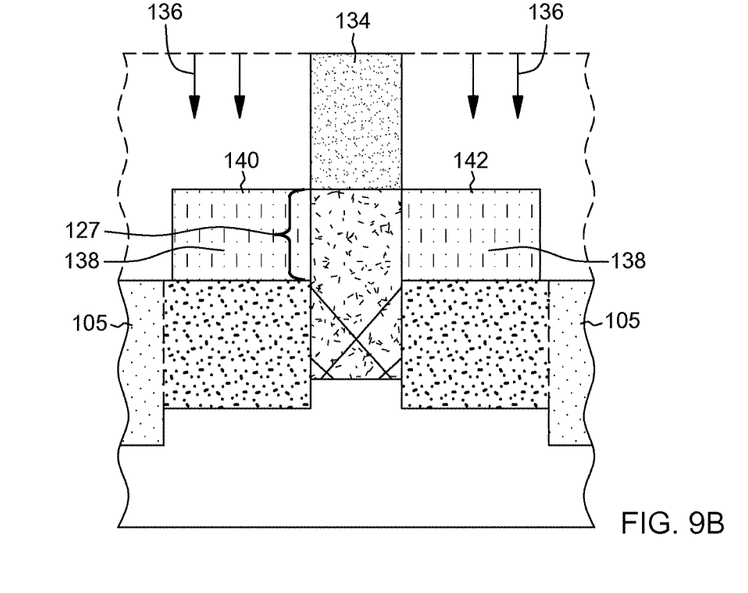
Figure 9C:
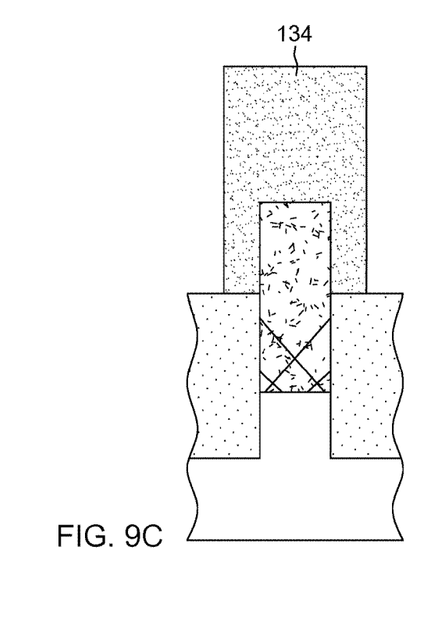

FIGS. 9A-9C depict one example of two cross-sectional views (FIGS. 9B and 9C) and a top-down view (FIG. 9A) of the structure of FIGS. 8A-8C after recessing 136 dielectric material 114 down to a bottom of the active portion 127, and growing epitaxial semiconductor material 138 adjacent opposite sides of the top (active) portion 127 of the epitaxial semiconductor channel material 122, forming source 140 and drain 142, in accordance with one or more aspects of the present invention.

In one example, the epitaxial semiconductor material 138 of the source 140 and drain 142 may be grown, for example, using lateral growth from the channel sidewalls.

Figure 10A:
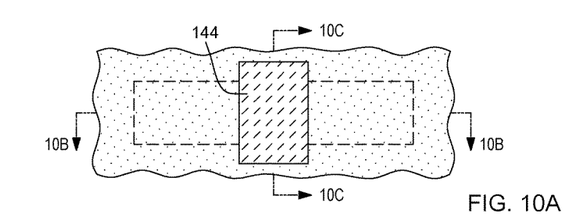
FIGS. 10A-10C depict one example of two cross-sectional views (FIGS. 10B and 10C) and a top-down view (FIG. 10A) of the structure of FIGS. 9A-9C after replacing the dummy gate with a conductive gate and filling around the gate with additional dielectric material (e.g., an interlayer dielectric), in accordance with one or more aspects of the present invention.
Figure 10B:
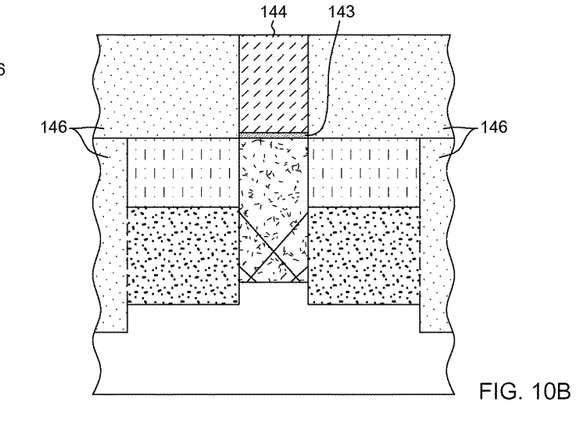
Figure 10C:
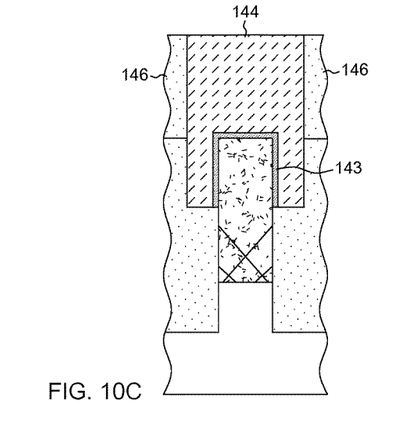

FIGS. 10A-10C depict one example of two cross-sectional views (FIGS. 10B and 10C) and a top-down view (FIG. 10A) of the structure of FIGS. 9A-9C after replacing the dummy gate (134, any of FIGS. 9A-9C) with a conductive gate 144 and filling around the gate with additional dielectric material 146 (e.g., an interlayer dielectric), in accordance with one or more aspects of the present invention. In one example, the conductive gate includes a conductive metal (e.g., tungsten). In another example, just prior to forming the replacement metal gate, the gate trench may be lined with a gate dielectric material, for example, a high-k gate dielectric (i.e., k>3.9).

In a first aspect, disclosed above is a method. The method includes providing a starting semiconductor structure, the starting semiconductor structure including a bulk semiconductor substrate, a semiconductor fin(s) on the semiconductor substrate that is surrounded by a dielectric layer, and a dummy gate over a channel region of the semiconductor fin(s). The method further includes forming source and drain recesses adjacent the channel region, filling the source and drain recesses with a dielectric material, removing the dummy gate, recessing the channel region of the semiconductor fin, the recessing leaving a fin opening(s) above the recessed fin(s), and growing epitaxial semiconductor channel material in the fin opening(s), such that at least a majority of defects associated with the growing are trapped at a bottom portion of the fin opening(s).

In one example, the growing may include, for example, over-growing the epitaxial semiconductor channel material, the over-growing filling space left by removing the dummy gate, and recessing the epitaxial semiconductor channel material, the recessing reopening the space of the dummy gate and resulting in recessed epitaxial semiconductor channel material. In one example, the method may further include, for example, forming another dummy gate surrounding a top portion of the recessed epitaxial semiconductor channel material after recessing the epitaxial semiconductor channel material, removing the dielectric material of the source and drain regions, resulting in new source and drain recesses, and forming a source and drain in the new source region and drain recesses, respectively. In one example, forming another dummy gate may include, for example, recessing portions of the dielectric layer surrounding the top portion of the recessed epitaxial semiconductor channel material, the recessing of the dielectric layer forming another dummy gate opening, and filling the another dummy gate opening with dummy gate material.

In one example, the method may further include, for example, replacing the another dummy gate with a conductive gate after forming the source and drain in the new source and drain recesses.

In a second aspect, disclosed above is a method. The method includes providing a bulk semiconductor substrate, forming fins on the bulk semiconductor substrate, forming channels, replacing channel regions of the fins with epitaxial semiconductor channel material having at least a majority of defects associated with the forming of the channels being trapped at a bottom portion of the channels, top portions of the channels being active channel regions and almost defect-free.

In one example, the method of the second aspect may further include, for example, forming a dummy gate surrounding only the active channel regions. In one example, the semiconductor substrate provided may include, for example, a bulk semiconductor substrate, and forming the channels with at least a majority of defects trapped at a bottom portion of the channels may include, for example, partially recessing the channel regions of the fins, the partially recessing resulting in channel region openings, and filling the channel region openings with the epitaxial semiconductor channel material, such that the defects are trapped at a bottom portion of the filled channel region openings.

In a third aspect, disclosed above is a FinFET. The FinFET includes a fin, and a conductive gate surrounding a top portion of a channel region of the fin, the channel region of the fin being filled with an epitaxial semiconductor channel material extending below the conductive gate, at least a majority of defects associated with forming the epitaxial semiconductor channel material in the channel region being trapped below the top portion of the channel region.

In one example, the FinFET may further include, for example, a source region and a drain region on opposite sides of the top portion of the channel region.

In one example, the conductive gate of the FinFET of the third aspect may include, for example, conductive metal(s). In one example, the conductive metal(s) may include, for example, tungsten.

In one example, the FinFET of the third aspect may further include, for example, a gate dielectric between the conductive gate and the top portion of the channel region. In one example, the gate dielectric may include, for example, a high-k gate dielectric.

In one example, a lower portion of the channel region of the FinFET of the third aspect, with the majority of defects trapped therein, may be, for example, surrounded by dielectric material.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A FinFET, comprising:
   a substrate;
   a fin on the substrate, the fin having a source region, a drain region and a channel region therebetween, the channel region having a non-epitaxial original portion on the substrate and a region of epitaxial semiconductor channel material on the non-epitaxial original portion; and
   a conductive gate surrounding a top portion of the region of epitaxial semiconductor channel material, the region of epitaxial semiconductor channel material extending below the conductive gate;
   wherein defects associated with forming the epitaxial semiconductor channel material in the channel region are trapped below the top portion of the region of epitaxial semiconductor channel material.

2. The FinFET of claim 1, further comprising a source region and a drain region on opposite sides of the top portion of the region of epitaxial semiconductor channel material.

3. The FinFET of claim 1, wherein the conductive gate comprises one or more conductive metals.

4. The FinFET of claim 3, wherein the one or more conductive metals comprises tungsten.

5. The FinFET of claim 1, further comprising a gate dielectric between the conductive gate and the top portion of the region of epitaxial semiconductor channel material.

6. The FinFET of claim 5, wherein the gate dielectric comprises a high-k gate dielectric.

7. The FinFET of claim 1, wherein a lower portion of the channel region, the defects trapped therein, is surrounded by dielectric material.

8. The FinFET of claim 1, wherein the non-epitaxial original portion of the fin comprises substantially less than half of a total height of the region.

9. The FinFET of claim 8, wherein the non-epitaxial original portion of the fin comprises about 25 percent of the total height.

* * * * *